United States Patent [19]

Jost et al.

[11] Patent Number: 5,307,357
[45] Date of Patent: Apr. 26, 1994

[54] PROTECTION MEANS FOR RIDGE WAVEGUIDE LASER STRUCTURES USING THICK ORGANIC FILMS

[75] Inventors: Mark E. Jost, Fishkill; Ranee W. Kwong; Abbas Behfar-Rad, both of Wappingers Falls; Peter P. Kwan, LaGrangeville, all of N.Y.

[73] Assignee: International Business Machines Corporation, Armonk, N.Y.

[21] Appl. No.: 972,041

[22] Filed: Nov. 5, 1992

[51] Int. Cl.$^5$ .................................................. H01S 3/30
[52] U.S. Cl. .................................................. 372/7; 372/43
[58] Field of Search .................. 372/7, 43, 45, 47, 48, 372/46, 50

[56] References Cited

U.S. PATENT DOCUMENTS

| 4,377,815 | 3/1983 | Sugino et al. | 372/45 |
| 4,424,527 | 1/1984 | Rao et al. | 372/36 X |
| 4,468,850 | 9/1984 | Liau et al. | 156/649 X |
| 4,605,942 | 8/1986 | Camlibel et al. | 372/36 X |
| 4,615,032 | 9/1986 | Holbrook et al. | 372/45 |
| 4,805,184 | 2/1989 | Fiddyment et al. | 372/96 |
| 4,851,368 | 7/1989 | Behfar-Rad et al. | 437/129 |
| 4,870,468 | 9/1989 | Kinoshita et al. | 372/46 X |
| 4,935,936 | 6/1990 | Nelson et al. | 372/46 |
| 4,958,202 | 9/1990 | Kinoshita et al. | 372/46 X |
| 5,042,045 | 8/1991 | Sato | 372/46 |
| 5,052,005 | 9/1991 | Tanaka et al. | 372/36 |
| 5,059,552 | 10/1991 | Harder et al. | 437/129 |
| 5,084,893 | 1/1992 | Sekii et al. | 372/46 |
| 5,099,488 | 3/1992 | Ahrabi et al. | 372/50 X |
| 5,115,090 | 5/1992 | Sachdev et al. | 528/323 |
| 5,138,626 | 8/1992 | Yap | 372/46 |
| 5,173,913 | 12/1992 | Kaneno | 372/46 |
| 5,214,661 | 5/1993 | Blondeau et al. | 372/43 X |
| 5,237,639 | 8/1993 | Kato et al. | 385/131 |

FOREIGN PATENT DOCUMENTS 03-183178  12/1989  Japan ................. 372/45 X

OTHER PUBLICATIONS

Ash et al., IEEE Proc. vol. 137, No. 5, Oct. 1990 R. Ash et al. pp. 315-317.
Josh et al., IEEE Phot. Tech. Lett., vol. 2, No. 10, Oct. 1990 M. Jost et al. pp. 697-698.

*Primary Examiner*—Brian Healy
*Attorney, Agent, or Firm*—Perman & Green

[57] ABSTRACT

What is disclosed is a semiconductor ridge waveguide laser structure having mechanical protection of ridge element by means of a thick, multi-layer organic material. The organic material, which may be a polyimide film, is deposited over the ridge element. The present invention also provides a fabrication process for depositing the protective means on the ridge element including deposition and photolithographic steps.

5 Claims, 2 Drawing Sheets

PROTECTION MEANS FOR RIDGE WAVEGUIDE LASER STRUCTURES USING THICK ORGANIC FILMS

FIELD OF THE INVENTION

The present invention relates to semiconductor ridge waveguide laser structures and more particularly to a semiconductor ridge waveguide laser having a protected ridge element.

BACKGROUND OF THE INVENTION

A ridge waveguide laser is a multi-layer semiconductor structure with a waveguide optical cavity. In a typical configuration, a doped semiconductor substrate is provided having a first cladding layer disposed thereon. An active region layer is disposed on the first cladding layer, and a second cladding layer is located over the active layers. The second cladding layer includes a ridge portion which protrudes above the active region and forms part of the optical cavity.

The ridge waveguide laser structures are fabricated by semiconductor processes such as photolithography and deposition into bars of layered semiconductor materials which are diced, mirror coated and mounted as individual laser devices.

The ridges of the ridge waveguide laser protrude above the surface of the substrate. During the mirror cleaving, mirror coating bar testing, dicing and mounting, the fragile ridges which form the waveguides are susceptible to damage.

SUMMARY OF THE INVENTION

The present invention provides a semiconductor ridge waveguide laser structure having mechanical protection of the ridge element by means of a thick, multi-layer organic material. The organic material, which may be a polyimide film, is deposited over the ridge element. The present invention also provides a fabrication process for depositing the protective means on the ridge element.

DESCRIPTION OF THE PREFERRED EMBODIMENTS

Figure 1:
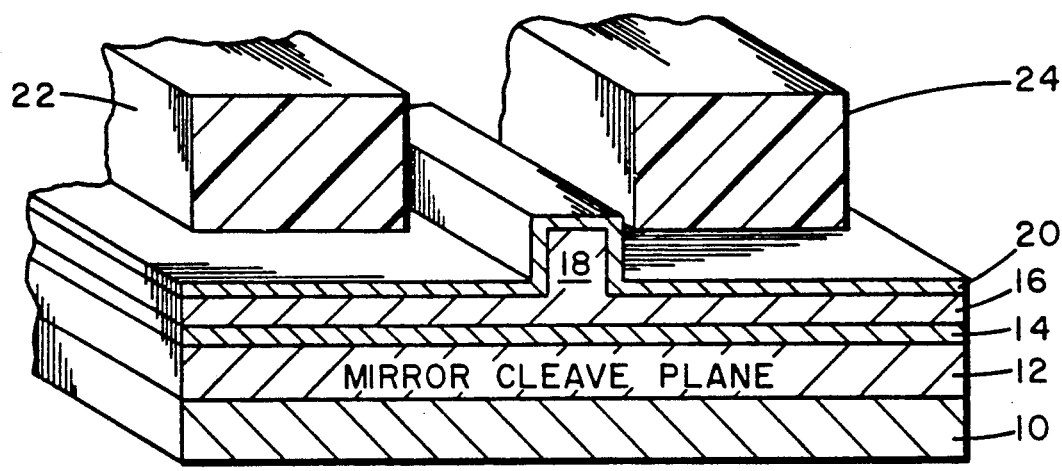
FIG. 1 is a perspective view of one embodiment of a ridge waveguide laser including a protective means for the ridge element according to the principles of the present invention.

Referring to FIG. 1, one embodiment of the present invention is illustrated showing ridge waveguide laser structure including a semiconductor substrate 10, a cladding layer 12, an active region layer 14 and another cladding layer 16 including the ridge portion 18. Typically, a top surface metal 20 is also provided over the structure.

In the present invention, the ridge 18 is protected by surrounding it with thick layers of very tough and stable organic films. The films are formed to be higher than the ridge 18. Forces, such as the compressive loads imposed on the laser bars during loading onto a mirror coating fixture, are transformed over the large areas of the thick organic films rather than the very small area of the ridge 18 itself.

Figure 2:
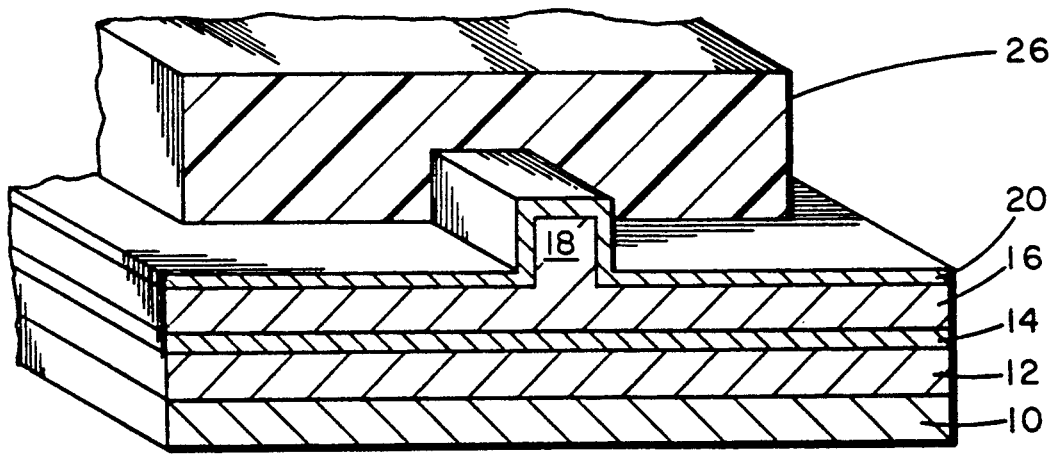
FIG. 2 is a perspective view or another embodiment or a ridge waveguide laser including a protective means for the ridge element according to the principles of for the present invention.

The thick organic films are applied and patterned after the lasers have received their top surface metal and prior to bar cleaving. Two different thick organic film embodiments have been successfully implemented. In the embodiment of FIG. 1, two large organic pads 22 and 24 are formed on either side of the ridge 18. In a second embodiment shown in FIG. 2, the film 26 embeds the ridge 18, itself. In both embodiments the films are recessed back from the cleave regions so as not to influence the quality or cleanliness of the cleaves. The mirror cleave plane in FIG. 1 and FIG. 2 is along the front of the structure and the dice cleave plane is in an orthogonal direction down the side of the structure.

The fabrication process for the present invention is described with respect to FIGS. 3, 4, 5, and 6 and starts after the top metal surface 20 is placed over the ridge layer 16.

Figure 3:
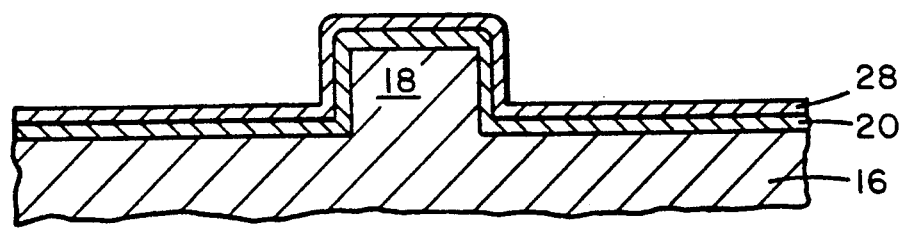
FIG. 3 is a schematic illustration of a cross-section view of a ridge waveguide laser used for the explanation of the fabrication process of the present invention.

Step 1. Apply a thin first layer 28 of polyimide material with excellent adhesion properties over the metal layer 20 as shown in FIG. 3.

Figure 4:
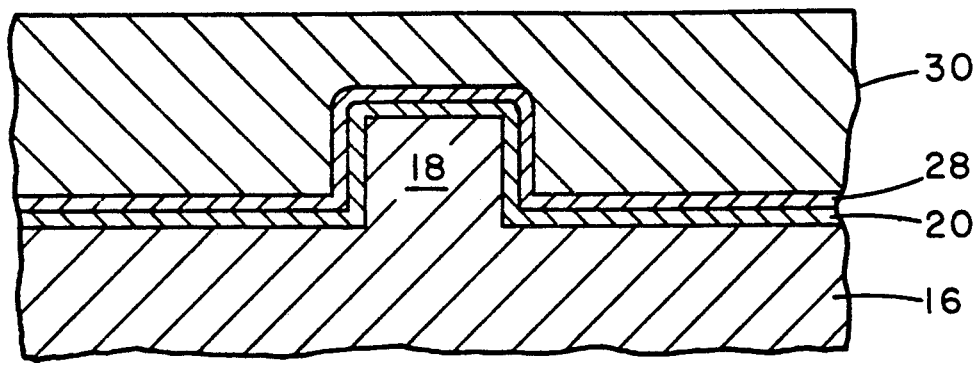
FIGS. 4, 5 and 6 are schematic illustrations of a cross-section view of a ridge waveguide laser during stages in the fabrication process.

Step 2. cure and prepare the surface of the layer 28 for good adhesion a thicker layer of low stress polyimide material Step 3. Applying a thick layer 30 of low stress polyimide material over layer 28 and cure as shown in FIG. 4.

Figure 5:
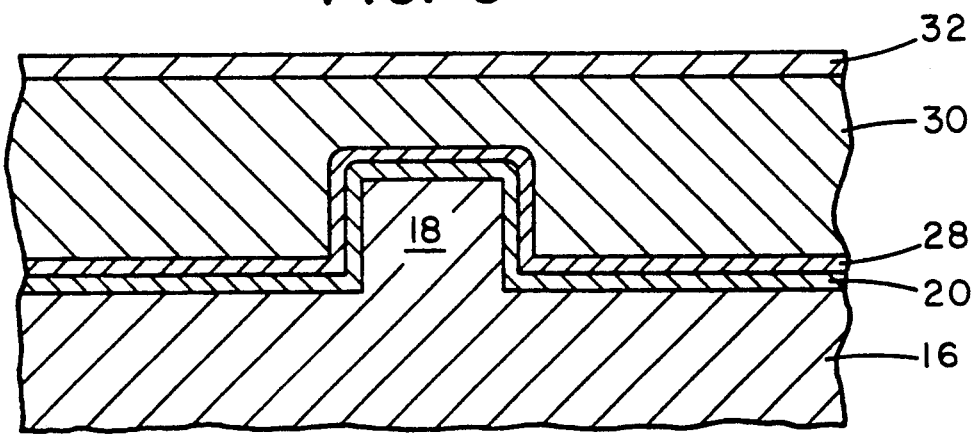

Step 4. Deposit image transfer mask material 32 such as sputtered silicon oxide over layer 30 as shown in FIG. 5.

Figure 6:
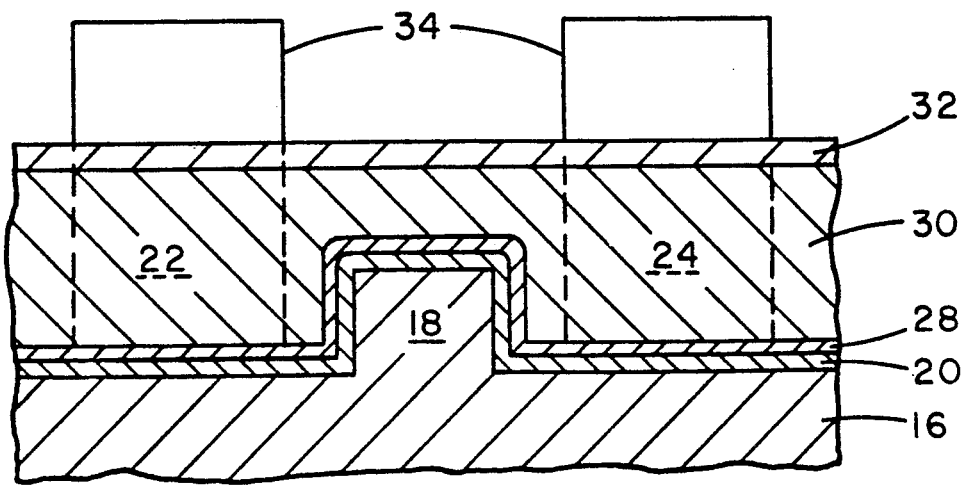

Step 5. Apply a photoresist layer 34 over the mask material and expose and develop the photoresist to form the desired pattern as shown in FIG. 6.

Step 6. Reactive ion etch the transfer material

Step 7. Reactive ion etch the polyimide layer 30 directly with $O_2$.

Step 8. Strip away the photoresist and mask material as shown in FIG. 6 to leave the two pads of organic film 22 and 24 remaining as shown in FIG. 1.

More particularly, the polyimide application of Step 1 and the curing in Step 2 involves preparing a combination of 0.1 grams of A1100 adhesion promoter and 99.9 grams of methanol or 94.9 grams of ethanol plus 5.0 grams of water. A standard wafer cleaning is performed and soak in A1100 for one minute and spin for 2 minutes at 3,000 r.p.m.

Immediately apply a thin layer of polyimide that sticks well to Au, nitride and GaAs, such as 60% Dupont PI 2566 and 40% NNP layer approximately 3,000 Angstroms thick.

The backside of the wafer is then cleaned and baked in a furnace at 90° C. for 15 seconds, 160° C. for 20 seconds, 240° C. for 30 seconds, 350° C. for 30 seconds.

Reactive ion etch in oxygen to enhance the adhesion for the next layer Soak in adhesion prompter in A1100 for one minute and spin for 2 minutes at 3,000 r.p.m. and apply a thick layer of Dupont PI 5811 (described in U.S. Pat. No. 5,115,090), a low stress, very tough polyimide which is applied by spinning-on. Bake again at the previous temperatures and time durations.

To form the ridge structure as set forth in Steps 3 through 8, 2,000 Angstroms of silicon dioxide dielectric are deposited by evaporation and standard photo sensitive resist AZ 410 is applied. Then the lithography steps of alignment, exposure development and baking are performed to pattern the polyimide as illustrated in FIG. 1.

To summarize, an adhesion promoter is first applied on the metal on the laser ridge material to aid the adhesion of the first polyimide layer. The first polyimide layer is Dupont PI 2566 because it has good adhesion properties but exhibits high stress, therefore only a thin coat is used.

The first polyimide layer is cored by baking so it does not redissolve during the formation of the second polyimide layer. The thin polyimide layer is then reactive ion etched in oxygen to aid in the adhesion the second polyimide layer Another application of adhesion of promoter A1100 is applied and a lower stress second polyimide layer such as Dupont PI 5811 is applied as a thick layer. As an alternative, BPDA-PDA type polyimide can also be used. The stress of the second polyimide layer is in the opposite direction from the stress of the first polyimide layer to significantly reduce the total stress.

The dielectric applied to the top of the second polyimide layer acts as a master image transfer mask for the imaging photoresist.

Thick organic film ridge protection according to the present invention offers an advantage over known ridge protection schemes which rely upon thick electroplated metal. To electroplate, the metal must have high current electrical continuity requiring this protective film to be all electrically interconnected. This puts severe constraints on complex wiring patterns that might be desirable for laser arrays or full wafer processing and testing layouts. In contrast, the thick organic films have no such interconnect restraints. These films are good isolations and can intersect multiple electrical lines each wired to different lasers layers without creating undesired electrical shorts.

While the invention has been particularly shown and described with respect to a preferred embodiment thereof, it will be understood by those skilled in the art that changes in form and details may be made therein without departing from the scope and spirit of the invention.

What is claimed is:

1. A semiconductor ridge waveguide laser structure of the type including an active region layer and a ridge layer disposed on said active region layer wherein said ridge layer includes a ridge portion which protrudes above said active region layer and a layer of metal over said ridge layer characterized in having a plurality of separate layers of organic polyimide material disposed on said metal layer over said ridge layer for mechanically protecting said protruding ridge.

2. A semiconductor ridge waveguide laser structure according to claim 1 wherein said plurality of separate layers of organic polyimide material is disposed on said metal layer over said ridge layer on either side of said protruding ridge, and wherein said organic material extends vertically higher than said protruding ridge.

3. A semiconductor ridge waveguide laser structure according to claim 1 wherein said plurality of separate layers of organic polyimide material is disposed on said metal layer over said ridge layer and extends over said protruding ridge.

4. A semiconductor ridge waveguide laser structure according to claim 2 wherein said organic material is composed of a plurality of layers of polyimide wherein a first layer of said plurality of layers of polyimide is a thin layer of polyimide having excellent adhesion properties disposed on said metal layer and wherein a second layer of said plurality of layers is a thick layer of low stress polyimide.

5. A semiconductor ridge waveguide laser structure according to claim 3 wherein said organic material is composed of a plurality of layers of polyimide wherein a first layer of said plurality of layers of polyimide is a thin layer of polyimide having excellent adhesion properties disposed on said metal layer and wherein a second layer of said plurality of layers is a thick layer of low stress polyimide.

* * * * *